(12) United States Patent
Khalaf

(10) Patent No.: US 11,848,311 B2
(45) Date of Patent: *Dec. 19, 2023

(54) MICROELECTRONIC PACKAGES HAVING A DIE STACK AND A DEVICE WITHIN THE FOOTPRINT OF THE DIE STACK

(71) Applicant: Intel Corporation, Santa Clara, CA (US)

(72) Inventor: Bilal Khalaf, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/681,354

(22) Filed: Feb. 25, 2022

(65) Prior Publication Data

US 2022/0181306 A1 Jun. 9, 2022

Related U.S. Application Data

(63) Continuation of application No. 16/087,543, filed as application No. PCT/US2016/029394 on Apr. 26, 2016, now Pat. No. 11,329,027.

(51) Int. Cl.
*H01L 25/065* (2023.01)
*H01L 23/00* (2006.01)
*H01L 25/00* (2006.01)

(52) U.S. Cl.
CPC ......... *H01L 25/0657* (2013.01); *H01L 24/32* (2013.01); *H01L 24/48* (2013.01);
(Continued)

(58) Field of Classification Search
CPC .............. H01L 25/043; H01L 25/0657; H01L 2225/06568; H01L 2225/06562
See application file for complete search history.

(56) References Cited

U.S. PATENT DOCUMENTS

| 2003/0011067 A1 | 1/2003 | Kimura |
| 2006/0027902 A1 | 2/2006 | Ararao et al. |

(Continued)

FOREIGN PATENT DOCUMENTS

KR 2008-0020137 3/2008

OTHER PUBLICATIONS

Extended European Search Report for EP Patent Application No. 16900678.0, dated Nov. 26, 2019.
(Continued)

*Primary Examiner* — Yu-Hsi D Sun
(74) *Attorney, Agent, or Firm* — Essential Patents Group, LLP

(57) ABSTRACT

A microelectronic package may be fabricated having a microelectronic die stack attached to a microelectronic substrate and at least one microelectronic device, which is separate from the microelectronic die stack, attached to the microelectronic substrate within the footprint of one of the microelectronic dice within the microelectronic die stack. In one embodiment, the microelectronic die stack may have a plurality of stacked microelectronic dice, wherein one microelectronic die of the plurality of microelectronic dice has a footprint greater than the other microelectronic die of the plurality of microelectronic dice, and wherein the at least one microelectronic device is attached to the one microelectronic die of the plurality of microelectronic dice having the greater footprint.

18 Claims, 9 Drawing Sheets

(52) U.S. Cl.
CPC .............. *H01L 24/73* (2013.01); *H01L 25/50* (2013.01); *H01L 2224/32145* (2013.01); *H01L 2224/48225* (2013.01); *H01L 2224/73265* (2013.01); *H01L 2225/06568* (2013.01)

(56) References Cited

U.S. PATENT DOCUMENTS

| | | |
|---|---|---|
| 2006/0043559 A1 | 3/2006 | Chow et al. |
| 2007/0278658 A1 | 12/2007 | Karnezos et al. |
| 2009/0236751 A1 | 9/2009 | Chin et al. |
| 2010/0230827 A1 | 9/2010 | Ogata et al. |
| 2012/0153432 A1 | 6/2012 | Karakane et al. |
| 2013/0049228 A1* | 2/2013 | Nam ...................... H01L 25/50 257/777 |

OTHER PUBLICATIONS

International Preliminary Report on Patentability for International Patent Application No. PCT/US16/29394, mailed Nov. 8, 2018.
International Search Report and Written Opinion for International Patent Application No. PCT/US16/29394, dated Dec. 8, 2016.
Notice of Allowance for U.S. Appl. No. 16/087,543, dated Jan. 25, 2022.
Office Action for European Patent Application No. 16900678.0, dated Feb. 10, 2022.
Office Action for U.S. Appl. No. 16/087,543, dated Sep. 3, 2021.
Restriction Requirement for U.S. Appl. No. 16/087,543, dated Apr. 30, 2021.

\* cited by examiner

MICROELECTRONIC PACKAGES HAVING A DIE STACK AND A DEVICE WITHIN THE FOOTPRINT OF THE DIE STACK

CLAIM OF PRIORITY

This application is a Continuation of U.S. patent application Ser. No. 16/087,543, filed on Sep. 21, 2018 and titled "MICROELECTRONIC PACKAGES HAVING A DIE STACK AND A DEVICE WITHIN THE FOOTPRINT OF THE DIE STACK", which is a National Stage Entry of, and claims priority to, PCT Application No. PCT/US16/29394, filed on Apr. 26, 2016 and titled "MICROELECTRONIC PACKAGES HAVING A DIE STACK AND A DEVICE WITHIN THE FOOTPRINT OF THE DIE STACK", which is incorporated by reference in its entirety for all purposes.

TECHNICAL FIELD

Embodiments of the present description generally relate to the field of microelectronic packaging, and, more particularly, to microelectronic packages which include a microelectronic die stack with at least one microelectronic device, which is separate from the microelectronic die stack, but within the footprint of the microelectronic die stack.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. One way to achieve these goals is by increasing integration density, such as fabricating System-In-Package (SIP) microelectronic packages, wherein an entire electronic system is formed in a single microelectronic package, which may include processors, application specific integrated circuit (ASIC) devices, volatile memory devices, non-volatile memory devices, power systems, wireless communication devices, and the like. In addition to increasing integration density, there is also a need for increased dimensional reduction (e.g. length (x), width (y), and height (z) dimensions). Reducing the length and width is important in order to reduce the surface area required on a printed circuit board, substrate, or module to which the microelectronic packages are mounted, and reducing the height is important to reduce the overall thickness of final product.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
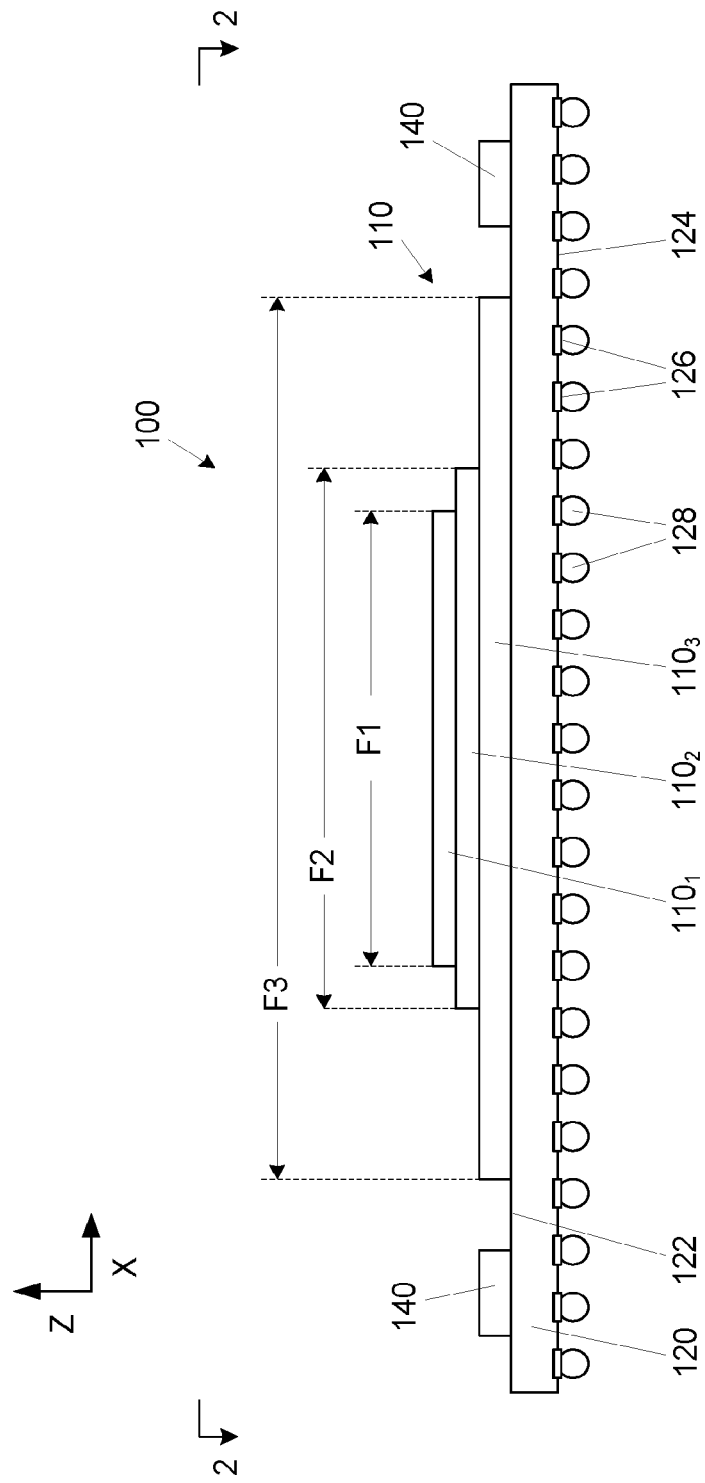
FIGS. 1 and 2 illustrate side and top plain views, respectively, of a microelectronic package.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description may include a microelectronic package having a microelectronic die stack attached to a microelectronic substrate and at least one microelectronic device, which is separate from the microelectronic die stack, attached to the microelectronic substrate within the footprint of one of the microelectronic dice within the microelectronic die stack. In one embodiment, the microelectronic die stack may have a plurality of stacked microelectronic dice, wherein one microelectronic die of the plurality of microelectronic dice has a footprint greater than the other microelectronic dice of the plurality of microelectronic dice, and wherein the at least one microelectronic device is attached to the one microelectronic die of the plurality of microelectronic dice having the greater footprint.

FIGS. 1 (side cross-sectional view) and 2 (top plan view along line 2-2 of FIG. 1) illustrate a microelectronic package 100 comprising a microelectronic die stack 110 mounted on a first surface 122 of a microelectronic substrate 120. The microelectronic die stack 110 may include a plurality of microelectronic dice, illustrated as a first microelectronic die $110_1$, a second microelectronic die $110_2$, and a third microelectronic die $110_3$. The microelectronic dice $110_1$, $110_2$, and $110_3$ may be any appropriate dice, including, but not limited to, microprocessors, chipsets, graphics devices, wireless devices, memory devices, application specific integrated circuit devices, or the like. The microelectronic dice $110_1$, $110_2$, and $110_3$ may be electrically connected between one another and/or to the microelectronic substrate 120 with any appropriate connection structures, such as bond wires, solder balls, through-silicon vias and the like; however, for purposes of clarity, these connection structures are not shown in FIGS. 1 and 2.

Figure 2:
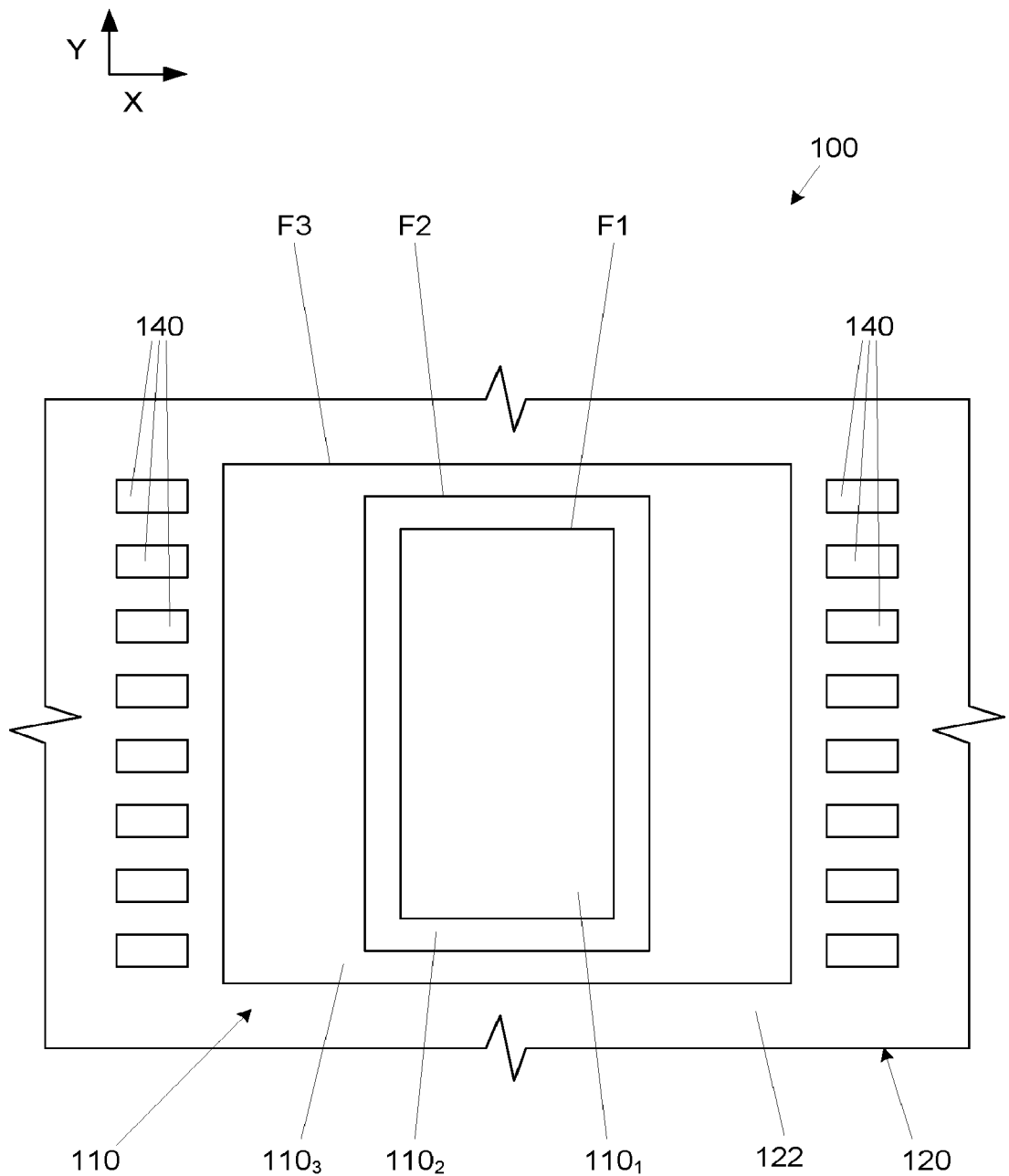

As shown in FIGS. 1 and 2, the microelectronics dice $110_1$, $110_2$, and $110_3$ are generally stacked in order of decreasing periphery size or "footprint" (i.e. by increasing X and Y size of FIG. 2) which is labeled as elements F1, F2, and F3, respectively. Thus, the third microelectronic die $110_3$ having the greatest footprint F3 is adjacent the microelectronic substrate 120 and the first microelectronic die $110_1$ having the smallest footprint F1 is the uppermost microelectronic die of the microelectronic die stack 110. The greatest footprint F3 defines the footprint of the microelectronic die stack 100.

As further shown in FIGS. 1 and 2, at least one microelectronic device 140, which is external to the microelectronic die stack 110, may be electrically attached to the microelectronic substrate first surface 122 outside of the greatest footprint F3 of the microelectronic die stack 110. The microelectronic device(s) 140 may be any appropriate passive devices, including, but not limited to, resistors, capacitors, inductors, and the like, and/or may be any appropriate active device, including, but not limited to, microprocessors, chipsets, graphics devices, wireless devices, memory devices, application specific integrated circuit devices, and the like. The microelectronic device(s) 140 may be electrically attached to the microelectronic substrate first surface 122 by any known technique, including, but not limited to, surface mount technology.

It is noted that the microelectronic substrate 120 may comprise any appropriate dielectric material, including, but not limited to, liquid crystal polymer, epoxy resin, bismaleimide triazine resin, FR4, polyimide materials, and the like, and may include conductive routes (not shown) formed therein and/or thereon to form any desired electrical route within the microelectronic substrate 120, including, but not limited to the microelectronic die stack 110, the microelectronic devices 140, as well as to bond pads 126 in or on a second surface 124 of the microelectronic substrate 120. As further shown in FIG. 1, external interconnects, such as solder balls 128 may be formed on the bond pads 126 for attaching the microelectronic package 100 to external components (not shown).

Figure 3:
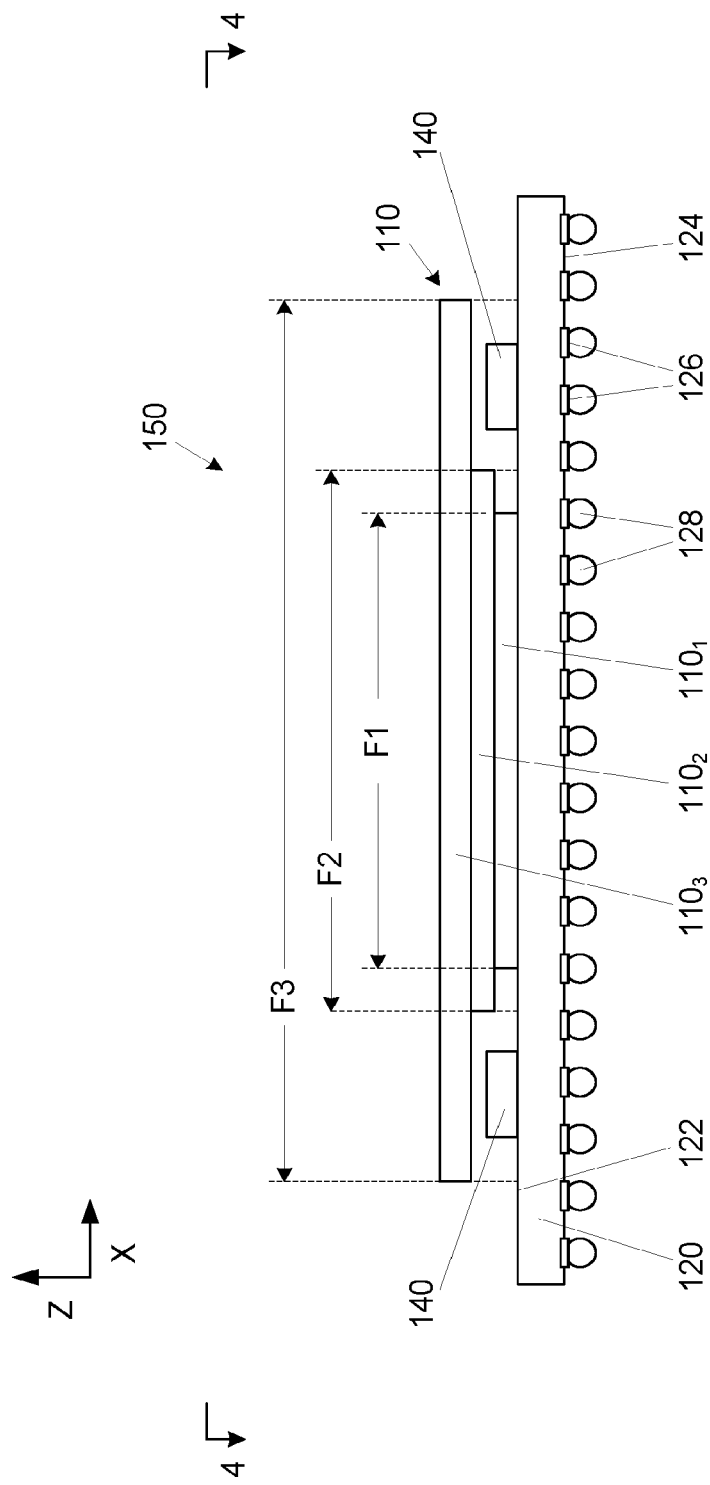
FIGS. 3 and 4 illustrate side and top plain views, respectively, of a microelectronic package, according to an embodiment of the present description.

FIGS. 3 (side cross-sectional view) and 4 (top plan view along line 4-4 of FIG. 3) illustrate an embodiment of the present description, wherein the microelectronics dice $110_1$, $110_2$, and $110_3$ may stacked in order of increasing periphery size or "footprint" (i.e. by increasing X and Y size of FIG. 4) F1, F2, and F3, respectively. Thus, the first microelectronic die $110_1$ having the smallest footprint F1 is adjacent the microelectronic substrate 120 and the third microelectronic die $110_3$ having the greatest footprint F3 is the uppermost microelectronic die of the microelectronic die stack 110. This stacking configuration creates open area on the microelectronic substrate first surface 122 and, thus, the at least one microelectronic device 140 may be electrically attached to the microelectronic substrate first surface 122 inside of the greatest footprint F3 of the microelectronic die stack 110 to form a microelectronic package 150. By using the area on the microelectronic substrate first surface 122 within the greatest footprint F3, the overall X-Y size of the microelectronic substrate 120 may be reduced, as will be understood to those skilled in the art.

Figure 4:
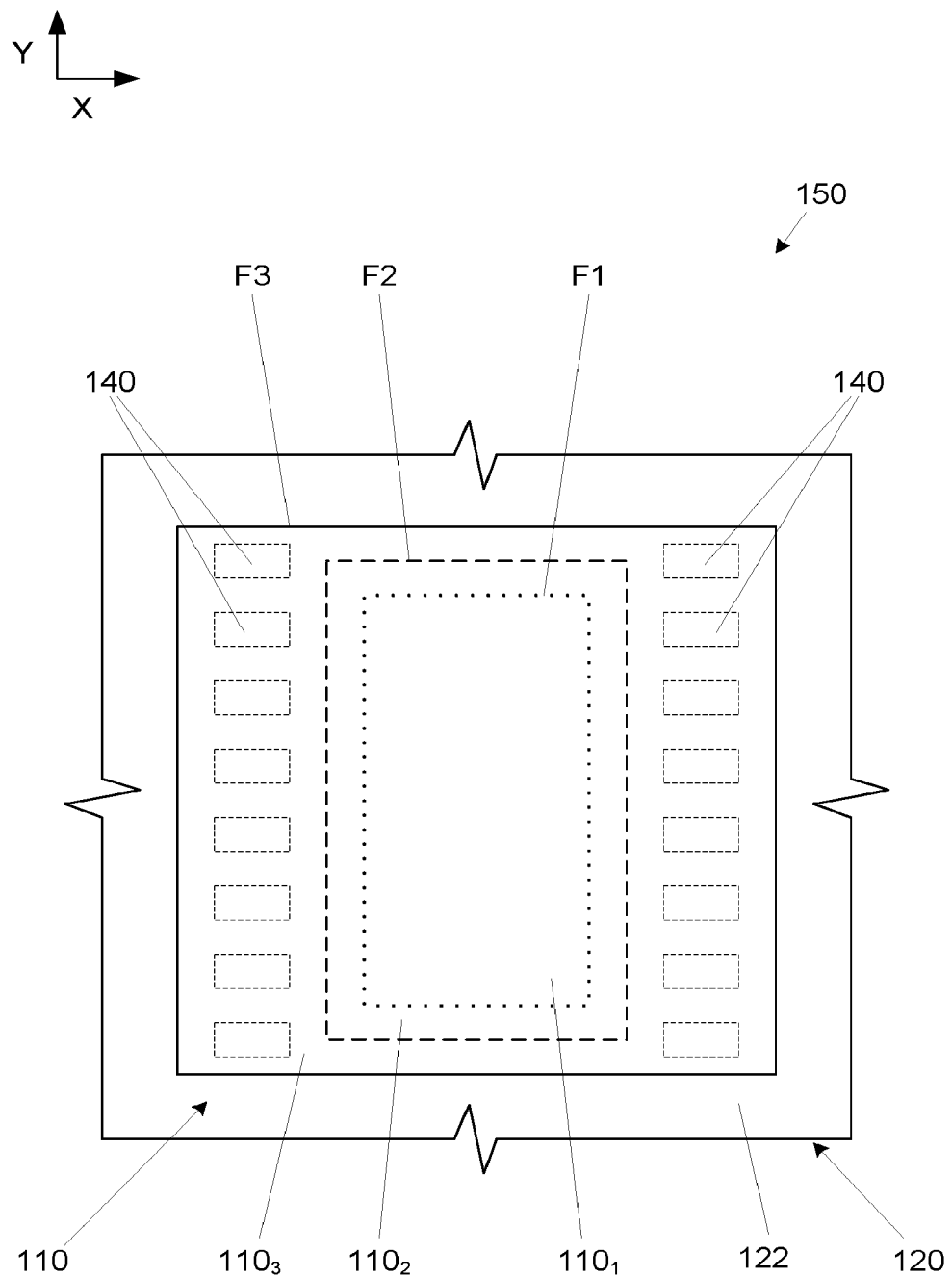
Figure 5:
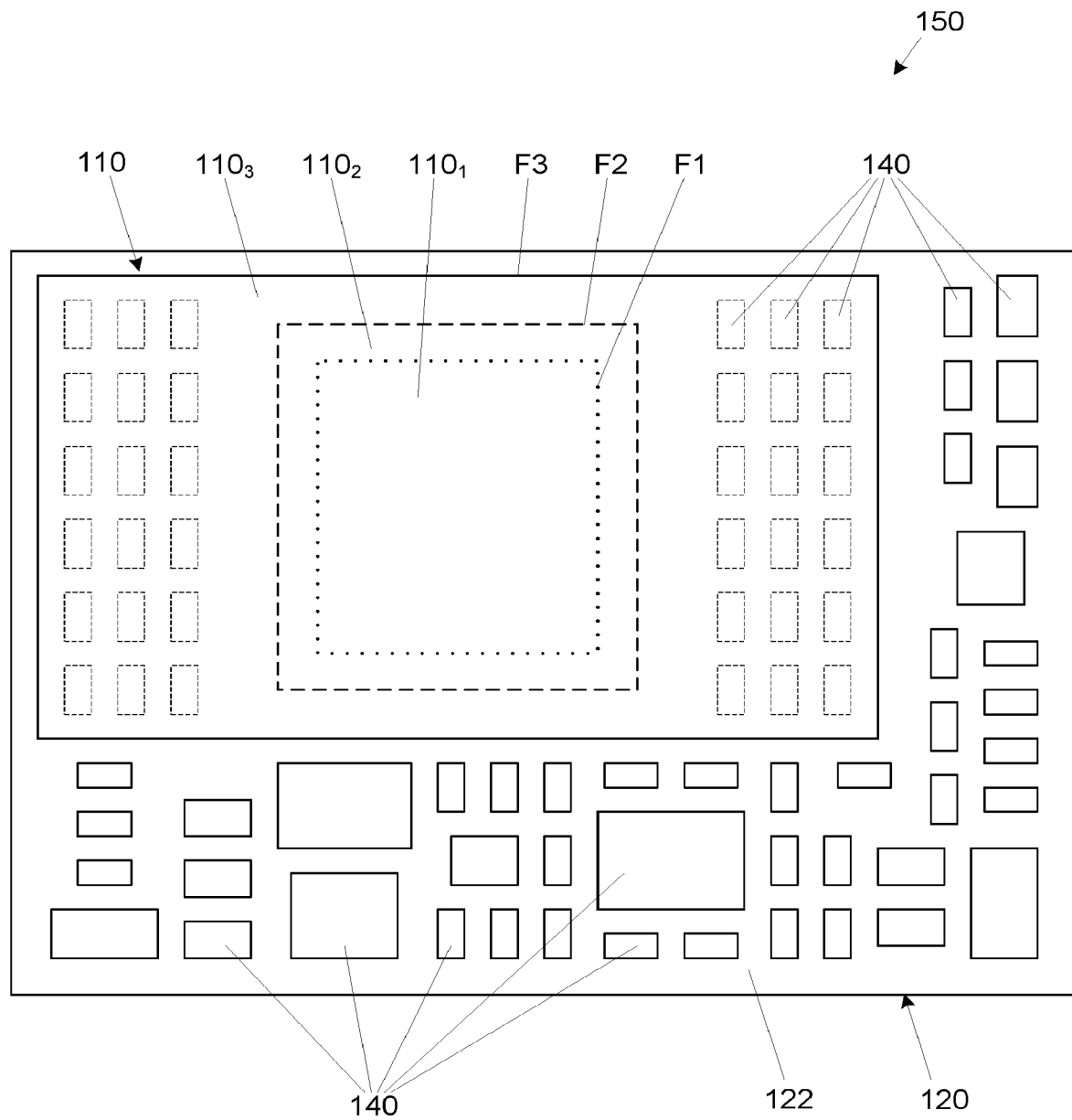
FIG. 5 illustrates a top plain view of the microelectronic package, according to another embodiment of the present description.

Although FIGS. 3 and 4 illustrate a single row of microelectronic devices 140 (shown in dashed shadow lines in FIG. 4) on opposing sides of the microelectronic device stack 110, embodiments of the present description are not so limited. As shown in FIG. 5, any appropriate number of microelectronic devices 140 may be positioned within the greatest footprint F3, as well as any appropriate number of microelectronic devices 140 outside of the greatest footprint F3 to form the microelectronic package 150.

Figure 6:
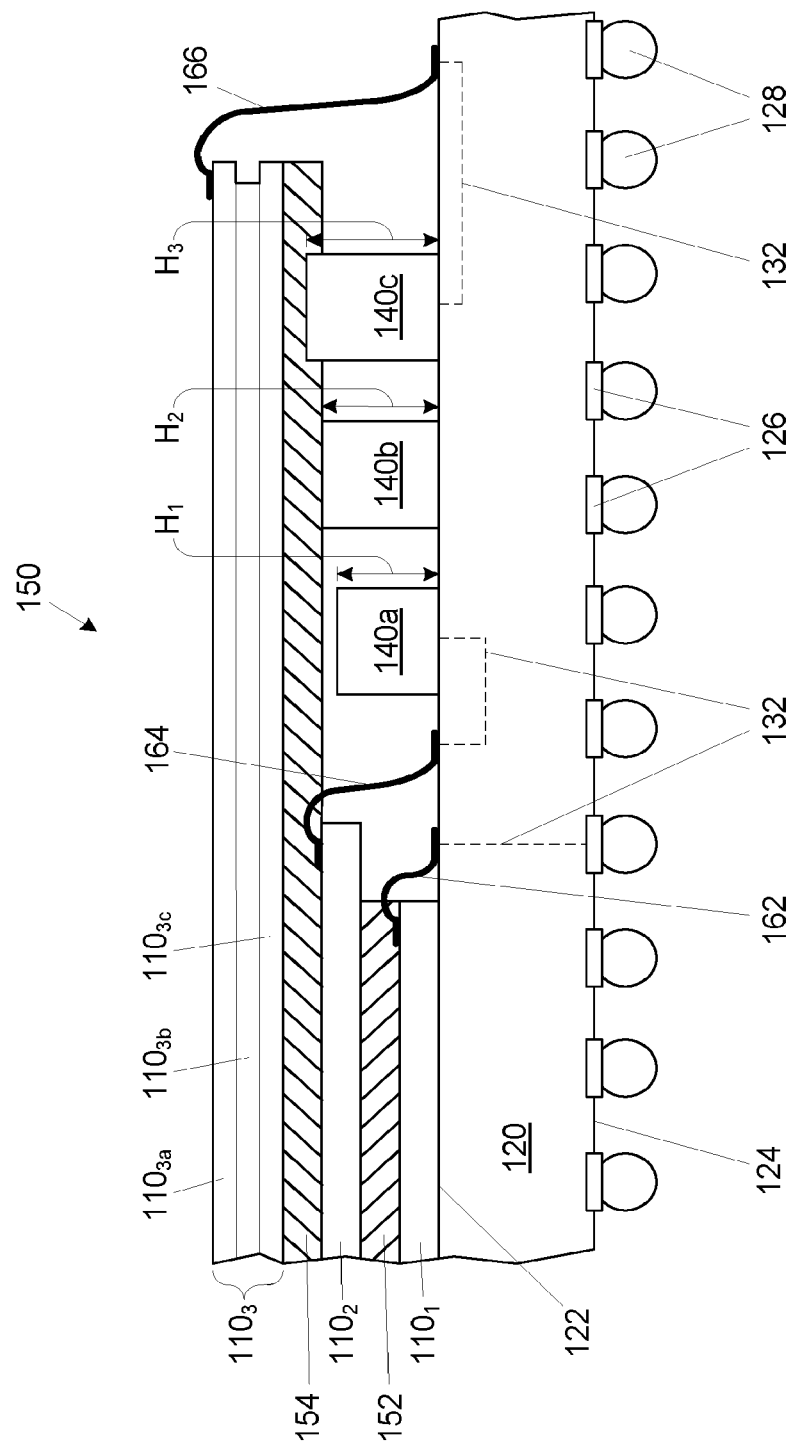
FIG. 6 illustrates cross-sectional view of a configuration of a portion of the microelectronic package, according to one embodiment of the present description.
Figure 7:
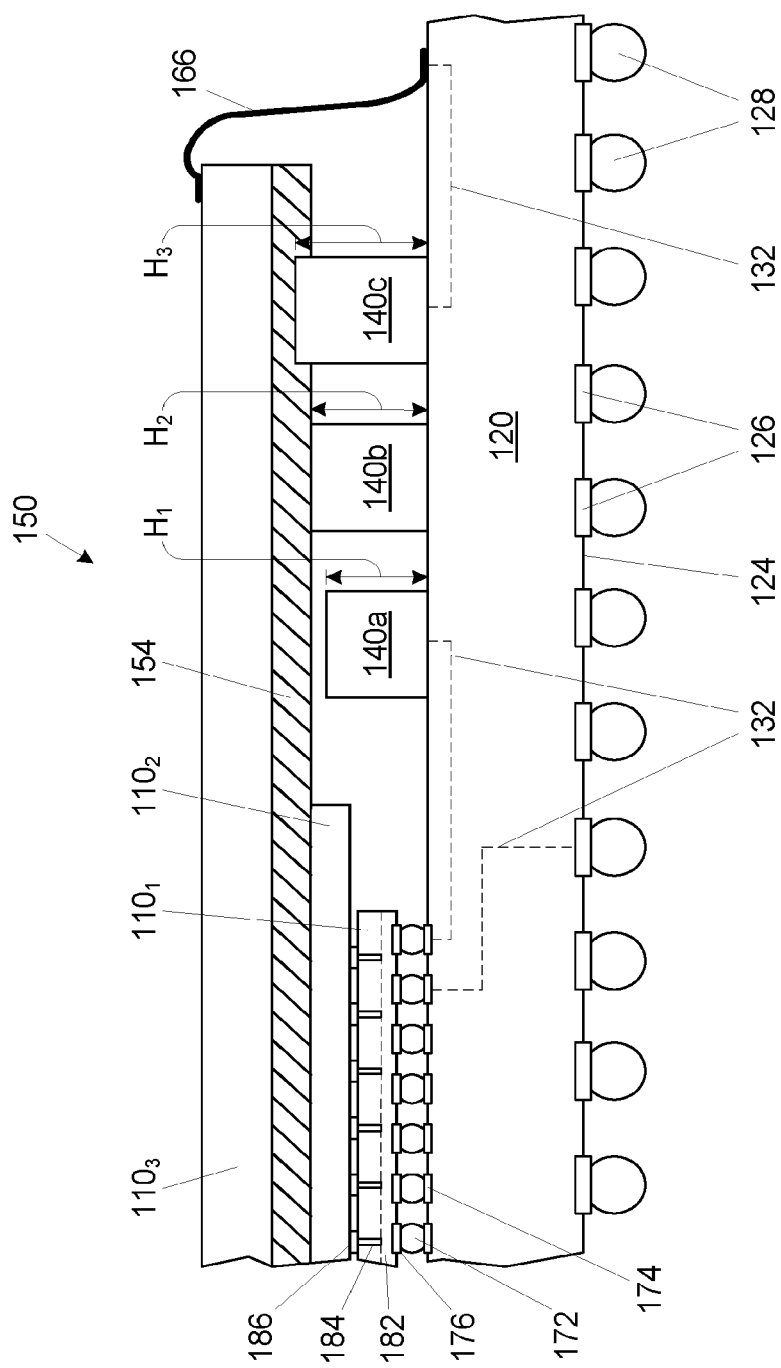
FIG. 7 illustrates cross-sectional view of a configuration of a portion of the microelectronic package, according to a further embodiment of the present description.

FIGS. 6 and 7 illustrate embodiments of the present description. As shown in FIG. 6, the first microelectronic die $110_1$, the second microelectronic die $110_2$, and the third microelectronic die $110_3$ may be electrically connected to the microelectronic substrate 120 through a plurality of bond wires 162, 164, and 166, respectively. As also shown in FIG. 6, conductive routes 132 formed within the microelectronic substrate 120 route signals to the various components of the microelectronic package 150. As further shown in FIG. 6, the second microelectronic die $110_2$ may be attached to the first microelectronic die $110_1$ with a first die attach film 152 and the third microelectronic die $110_3$ may be attached to the second microelectronic die $110_2$ with a second die attach film 154.

In one embodiment, the first microelectronic die $110_1$ may be an application specific integrated circuit device, the second microelectronic die $110_2$ may be a volatile memory device, such as a random access memory device, and the third microelectronic device $110_3$ having the largest footprint F3 (see FIG. 3) may be an non-volatile memory device, such as a NAND flash memory device. In a further embodiment, the third microelectronic die $110_3$ may be formed as a plurality of non-volatile memory device layers (illustrated as layers $110_{3a}$, $110_{3b}$, and $110_{3c}$).

As further shown in FIG. 6, the microelectronic devices 140 (see FIG. 5) may have varying heights, which are illustrated as a first microelectronic device 140a having a first height $H_1$, a second microelectronic device 140b having a second height $H_2$, and a third microelectronic device 140c having a third height $H_3$. As illustrated, the second die attach film 154 may extend between the third microelectronic device $110_3$ and the microelectronic devices may contact and/or extend into the second die attach film 154. This is illustrated as the second microelectronic device 140b contacting the second die attach film 154 and the third microelectronic device 140c extending into the second die attach film 154. As will be understood to those skilled in the art, when the microelectronic devices contacts or extends into the second die attach film 154, the third microelectronic die $110_3$ may be supported and the structural integrity of the microelectronic die stack 110 may be improved.

As shown in FIG. 7, the electrical connection of the microelectronic dice $110_1$, $110_2$, and $110_3$ is not limited to bond wires 162, 164, 166. By way of example, the microelectronic die $110_1$ may be electrically connected by interconnects 172, such as solder balls, extending between substrate bond pads 174 in or on the microelectronic substrate first surface 122 and mirror-image bond pads 176 in or on the first microelectronic die $110_1$. Furthermore, electrical interconnection may be achieved with through-silicon vias. For example, the first microelectronic die $110_1$ may be electrically connected to the second microelectronic die $110_2$ with through-silicon vias 184 extend from an active region 182 of first microelectronic die $110_1$ to connection pads 186 between the first microelectronic die $110_1$ and the second microelectronic die $110_2$.

As will be understood to those skilled in the art, the embodiments of present invention make better utilization of space, which that may result in a reduction of the size of the microelectronic package 100. Furthermore, as previously mentioned, when the microelectronic devices 140 are attached to one of the microelectronic dice within the microelectronic die stack 110, structural integrity of the microelectronic die stack 110 may be improved. Moreover, placing at least a portion of the microelectronic devices 140 (see, for example FIG. 5) closer to the microelectronic die stack 110, which may reduce signal length, thereby improving the performance of the microelectronic package 100.

Figure 8:
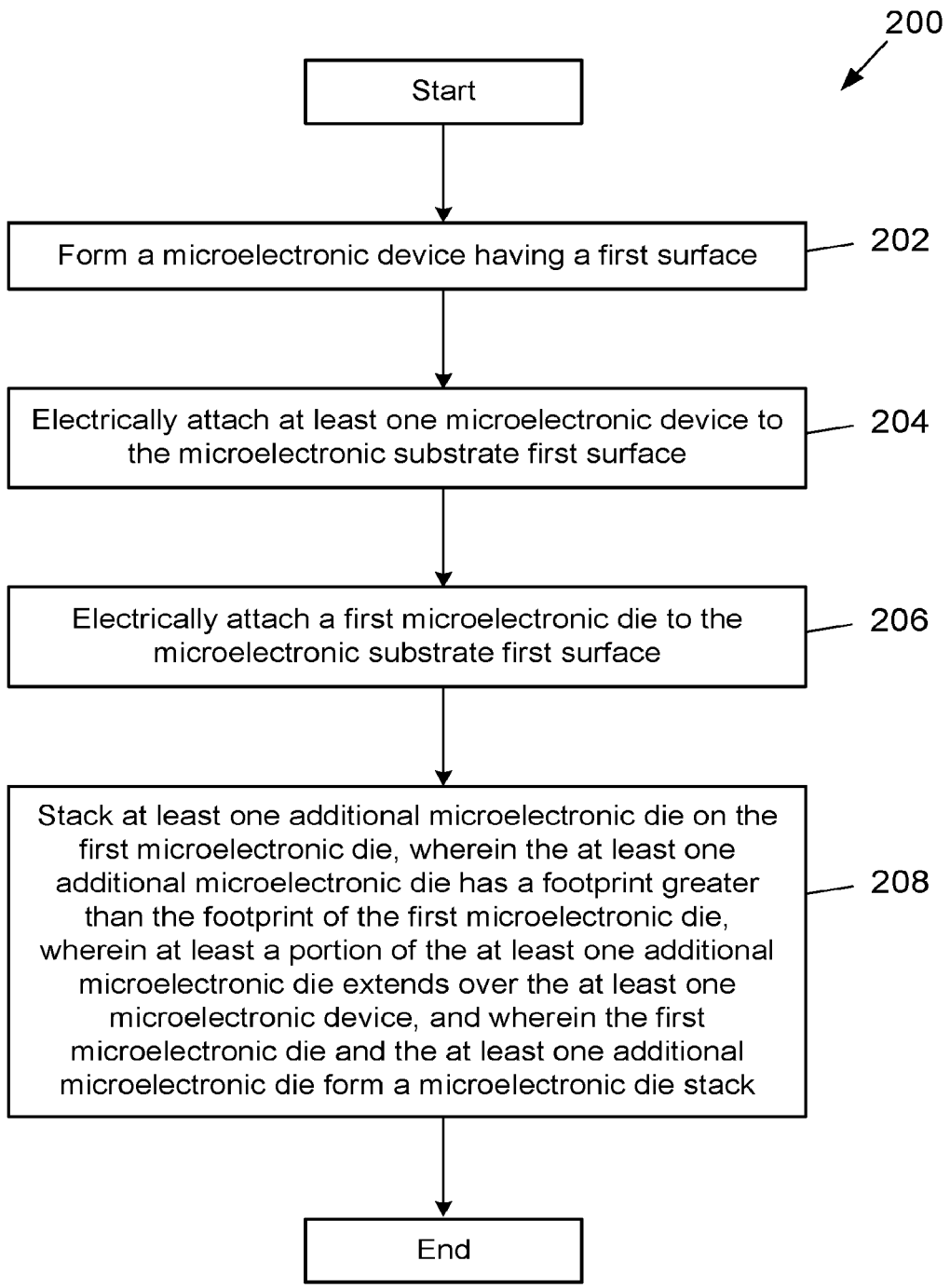
FIG. 8 is a flow diagram of a process of fabricating a microelectronic package, according to an embodiment of the present description.

FIG. 8 is a flow chart of a process 200 of fabricating a microelectronic package according to an embodiment of the present description. As set forth in block 202, a microelectronic substrate having a first surface may be formed. At least one microelectronic device may be electrically attached to the microelectronic substrate first surface, as set forth in block 204. As set forth in block 206, a first microelectronic die may be electrically attached to the microelectronic substrate first surface. At least one additional microelectronic die may be stacked on the first microelectronic die, wherein the at least one additional microelectronic die has a footprint greater than the footprint of the first microelectronic die, wherein at least a portion of the at least one additional microelectronic die extends over the at least one microelectronic device, and wherein the first microelectronic die and the at least one additional microelectronic die form a microelectronic die stack, as set forth in block 208.

Figure 9:
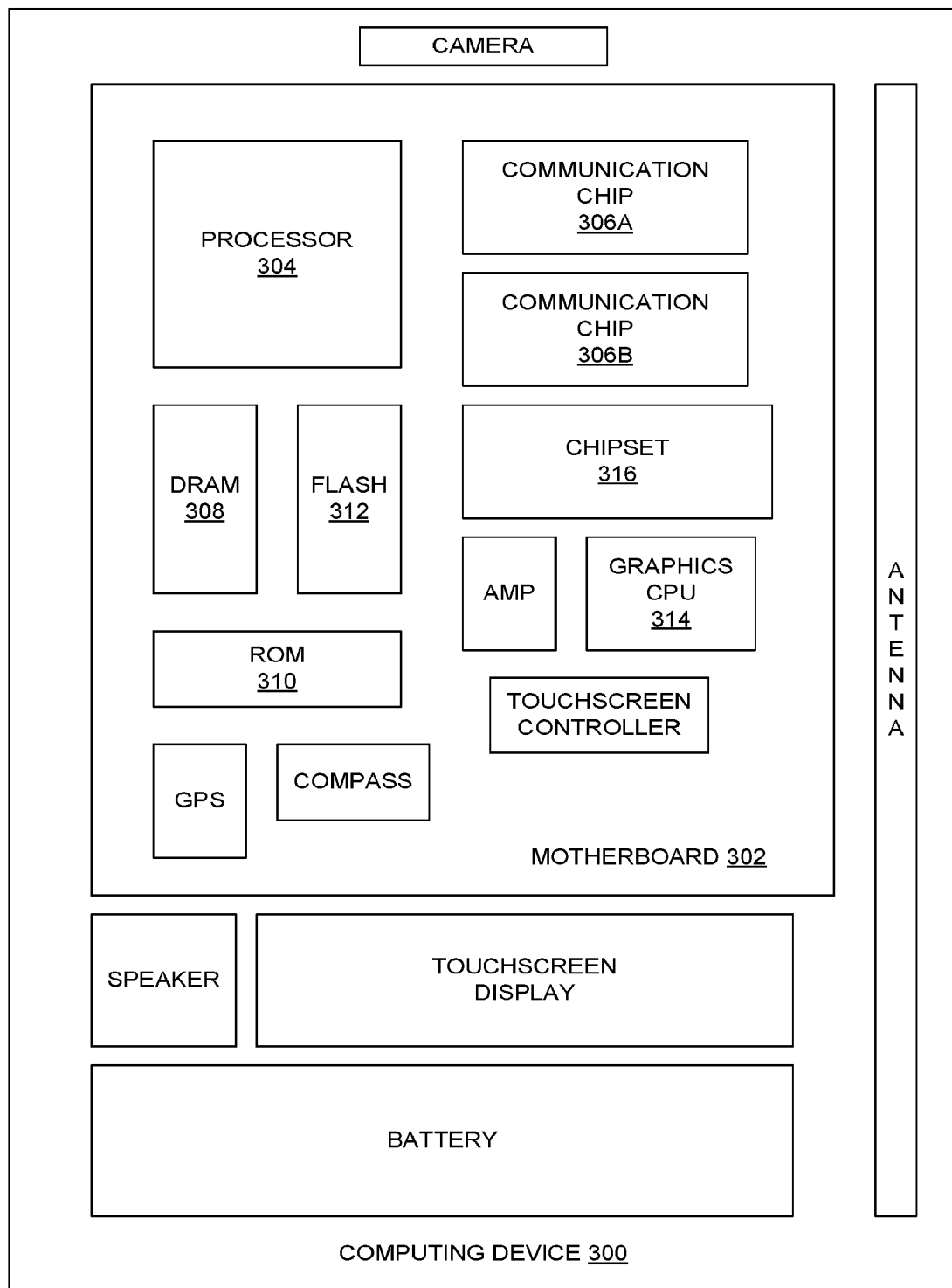
FIG. 9 illustrates a computing device in accordance with one implementation of the present description.

FIG. 9 illustrates a computing device 300 in accordance with one implementation of the present description. The computing device 300 houses a board 302. The board may include a number of microelectronic components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include a microelectronic package having a microelectronic die stack attached to microelectronic substrate and at least one microelectronic device electrically attached to the microelectronic substrate first surface within the footprint of one microelectronic die within the microelectronic die stack.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-9. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a microelectronic package, comprising a microelectronic substrate having a first surface; a microelectronic die stack electrically attached to the microelectronic substrate first surface, wherein the microelectronic die stack comprises a plurality of stacked microelectronic dice and wherein one microelectronic die of the plurality of microelectronic dice has a footprint greater than the other microelectronic die of the plurality of microelectronic dice; and at least one microelectronic device electrically attached to the microelectronic substrate first surface within the footprint of the one microelectronic die.

In Example 2, the subject matter of Example 1 can optionally include at least one microelectronic device electrically attached to the microelectronic substrate first surface outside the footprint of the one microelectronic die.

In Example 3, the subject matter of Example 1 can optionally include a die attach film disposed between the one microelectronic die and the other microelectronic die of the plurality of microelectronic dice, wherein the at least one microelectronic device contacts the die attach film.

In Example 4, the subject matter of Example 3 can optionally include the at least one microelectronic device extending into the die attach film.

In Example 5, the subject matter of any of Examples 1 to 4 can optionally include at least one bond wire electrically connecting the microelectronic die stack to the microelectronic substrate first surface.

In Example 6, the subject matter of Example 1 can optionally include the microelectronic die stack comprising a first microelectronic die attached to the microelectronic substrate first surface, a second microelectronic die stacked on and attached to the first microelectronic die, and a third microelectronic die stacked on and attached to the second microelectronic die, wherein the three microelectronic die has a footprint greater than the first microelectronic die and the second microelectronic die.

In Example 7, the subject matter of Example 6 can optionally include a die attach film, wherein the die attach film abuts the second microelectronic die and the third microelectronic die, and wherein the at least one microelectronic device contacts the die attach film.

In Example 8, the subject matter of Example 7 can optionally include the at least one microelectronic device extends into the die attach film.

In Example 9, the subject matter of Example 6 can optionally include the first microelectronic die comprising an application specific integrated circuit device, the second microelectronic die comprising a volatile memory device, and the third microelectronic die comprising a non-volatile memory device.

In Example 10, the subject matter of any of Examples 6 to 9 can optionally include the first microelectronic die is electrically attached to the microelectronic substrate first surface by interconnects extending between substrate bond pads on the microelectronic substrate first surface and mirror-image bond pads on the first microelectronic die.

In Example 11, a method of fabricating a microelectronic package may comprise package, comprising forming a microelectronic substrate having a first surface; electrically attaching at least one microelectronic device to the microelectronic substrate first surface; electrically attaching a first microelectronic die to the microelectronic substrate first surface; and stacking at least one additional microelectronic die on the first microelectronic die, wherein the at least one additional microelectronic die has a footprint greater than the footprint of the first microelectronic die, wherein at least a portion of the at least one additional microelectronic die extends over the at least one microelectronic device, and wherein the first microelectronic die and the at least one additional microelectronic die form a microelectronic die stack.

In Example 12, the subject matter of Example 11 can optionally include electrically attaching at least one microelectronic device to the microelectronic substrate first surface outside the footprint of the at least one additional microelectronic die.

In Example 13, the subject matter of Example 11 can optionally include disposing a die attach film abutting the at least one additional microelectronic die, wherein a portion of the die attach film is disposed between the at least one additional microelectronic die and the first microelectronic die, and wherein the at least one microelectronic device contacts the die attach film.

In Example 14, the subject matter of Example 13 can optionally include the at least one microelectronic device extending into the die attach film.

In Example 15, the subject matter of Example 11 can optionally include stacking at least one additional microelectronic die on the first microelectronic die comprises stacking a second microelectronic die stacked on and attached to the first microelectronic die, and stacking a third microelectronic die on and attached to the second microelectronic die.

In Example 16, the subject matter of Example 15 can optionally include disposing a die attach film abutting the second microelectronic die and abutting the third microelectronic die, and wherein at least one microelectronic device contacts the die attach film.

In Example 17, the subject matter of Example 16 can optionally include the at least one microelectronic device extending into the die attach film.

In Example 18, the subject matter of Example 15 can optionally include the first microelectronic die comprises an application specific integrated circuit device, wherein the second microelectronic die comprises a volatile memory device, and wherein the third microelectronic die comprises a non-volatile memory.

In Example 19, the subject matter of Example 11 to 18 can optionally include electrically connecting the microelectronic die stack to the microelectronic substrate first surface with at least one bond wire.

In Example 20, the subject matter of Example 11 to 18 can optionally include electrically attaching the first microelectronic die to the microelectronic substrate first surface by attaching interconnects extending between substrate bond pads on the microelectronic substrate first surface and mirror-image bond pads on the first microelectronic die.

In Example 21, an electronic system may comprise a board; and a microelectronic package attached to the board, wherein the microelectronic package includes a microelectronic substrate having a first surface; a microelectronic die stack electrically attached to the microelectronic substrate first surface, wherein the microelectronic die stack comprises a plurality of stacked microelectronic dice and wherein one microelectronic die of the plurality of microelectronic dice has a footprint greater than the other microelectronic die of the plurality of microelectronic dice; and at least one microelectronic device electrically attached to the microelectronic substrate first surface within the footprint of the one microelectronic die.

In Example 22, the subject matter of Example 21 can optionally include at least one microelectronic device electrically attached to the microelectronic substrate first surface outside the footprint of the one microelectronic die.

In Example 23, the subject matter of Example 21 can optionally include a die attach film disposed between the one microelectronic die and the other microelectronic die of the plurality of microelectronic dice, wherein the at least one microelectronic device contacts the die attach film.

In Example 24, the subject matter of Example 23 can optionally include the at least one microelectronic device extending into the die attach film.

In Example 25, the subject matter of any of Examples 21 to 24 can optionally include at least one bond wire electrically connecting the microelectronic die stack to the microelectronic substrate first surface.

In Example 26, the subject matter of Example 21 can optionally include the microelectronic die stack comprising a first microelectronic die attached to the microelectronic substrate first surface, a second microelectronic die stacked on and attached to the first microelectronic die, and a third microelectronic die stacked on and attached to the second microelectronic die, wherein the three microelectronic die has a footprint greater than the first microelectronic die and the second microelectronic die.

In Example 27, the subject matter of Example 26 can optionally include a die attach film, wherein the die attach film abuts the second microelectronic die and the third microelectronic die, and wherein the at least one microelectronic device contacts the die attach film.

In Example 28, the subject matter of Example 27 can optionally include the at least one microelectronic device extends into the die attach film.

In Example 29, the subject matter of Example 26 can optionally include the first microelectronic die comprising an application specific integrated circuit device, the second microelectronic die comprising a volatile memory device, and the third microelectronic die comprising a non-volatile memory device.

In Example 30, the subject matter of any of Examples 26 to 29 can optionally include the first microelectronic die is electrically attached to the microelectronic substrate first surface by interconnects extending between substrate bond pads on the microelectronic substrate first surface and mirror-image bond pads on the first microelectronic die.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic package, comprising:
   a microelectronic substrate having a first surface;
   a microelectronic die stack electrically attached to the first surface of the microelectronic substrate first surface, wherein the microelectronic die stack comprises a first microelectronic die attached to the first surface of the microelectronic substrate, a second microelectronic die stacked on the first microelectronic die, and a third microelectronic die stacked on the second microelectronic die, wherein a footprint of the first microelectronic die is within a footprint of the second microelectronic die, wherein the footprint of the second microelectronic die is within a footprint of the third microelectronic; and
   at least one microelectronic device electrically attached to the first surface of the microelectronic substrate, wherein the at least one microelectronic device is within the footprint of the third microelectronic die, and wherein the at least one microelectronic device is outside the footprint of the first microelectronic die and outside the footprint of the second microelectronic die.

2. The microelectronic package of claim 1, wherein the footprint of the second microelectronic die is larger than the footprint of the first microelectronic die.

3. The microelectronic package of claim 1, further comprising at least one bond wire electrically connecting the microelectronic die stack to the microelectronic substrate first surface.

4. The microelectronic package of claim 1, wherein the first microelectronic die is electrically attached to the microelectronic substrate first surface by interconnects extending between substrate bond pads on the microelectronic substrate first surface and mirror-image bond pads on the first microelectronic die.

5. The microelectronic package of claim 1, further comprising a die attach film, wherein the die attach film abuts the second microelectronic die and the third microelectronic die, and wherein the die attach film extends beyond the footprint of the second microelectronic die.

6. The microelectronic package of claim 1, wherein the first microelectronic die comprises an application specific integrated circuit device, wherein the second microelectronic die comprises a volatile memory device, and wherein the third microelectronic die comprises a non-volatile memory device.

7. A method of fabricating a microelectronic package, comprising:
   forming a microelectronic substrate having a first surface;
   electrically attaching at least one microelectronic device to the microelectronic substrate first surface;
   electrically attaching a first microelectronic die to the microelectronic substrate first surface;
   stacking a second microelectronic die on the first microelectronic die;
   stacking a third microelectronic die on the second microelectronic die, wherein a footprint of the first microelectronic die is within a footprint of the second microelectronic die, wherein the footprint of the second microelectronic die is within a footprint of the third microelectronic, wherein the at least one microelectronic device is within the footprint of the third microelectronic die, and wherein the at least one microelectronic device is outside the footprint of the first microelectronic die and outside the footprint of the second microelectronic die.

8. The method of claim 7, wherein the footprint of the second microelectronic die is larger than the footprint of the first microelectronic die.

9. The method of claim 7, further comprising electrically connecting the microelectronic die stack to the first surface of the microelectronic substrate with at least one bond wire.

10. The method of claim 7, wherein electrically attaching the first microelectronic die to the microelectronic substrate first surface comprises electrically attaching the first microelectronic die to the microelectronic substrate first surface by attaching interconnects extending between substrate bond pads on the microelectronic substrate first surface and mirror-image bond pads on the first microelectronic die.

11. The method of claim 7, further comprising forming a die attach film to abut the second microelectronic die and the third microelectronic die, and wherein the die attach film extends beyond the footprint of the second microelectronic die.

12. The method of claim 7, wherein the first microelectronic die comprises an application specific integrated circuit device, wherein the second microelectronic die comprises a volatile memory device, and wherein the third microelectronic die comprises a non-volatile memory.

13. An electronic system, comprising:
a board; and
a microelectronic package attached to the board, wherein the microelectronic package comprises:
  a microelectronic substrate having a first surface;
  a microelectronic die stack electrically attached to the first surface of the microelectronic substrate first surface, wherein the microelectronic die stack comprises a first microelectronic die attached to the first surface of the microelectronic substrate, a second microelectronic die stacked on the first microelectronic die, and a third microelectronic die stacked on the second microelectronic die, wherein a footprint of the first microelectronic die is within a footprint of the second microelectronic die, wherein the footprint of the second microelectronic die is within a footprint of the third microelectronic; and
at least one microelectronic device electrically attached to the first surface of the microelectronic substrate, wherein the at least one microelectronic device is within the footprint of the third microelectronic die, and wherein the at least one microelectronic device is outside the footprint of the first microelectronic die and outside the footprint of the second microelectronic die.

14. The electronic system of claim 13, wherein the footprint of the second microelectronic die is larger than the footprint of the first microelectronic die.

15. The electronic system of claim 13, further comprising at least one bond wire electrically connecting the microelectronic die stack to the microelectronic substrate first surface.

16. The electronic system of claim 13, wherein the first microelectronic die is electrically attached to the microelectronic substrate first surface by interconnects extending between substrate bond pads on the microelectronic substrate first surface and mirror-image bond pads on the first microelectronic die.

17. The electronic system of claim 13, further comprising a die attach film, wherein the die attach film abuts the second microelectronic die and the third microelectronic die, and wherein the die attach film extends beyond the footprint of the second microelectronic die.

18. The electronic system of claim 13, wherein the first microelectronic die comprises an application specific integrated circuit device, wherein the second microelectronic die comprises a volatile memory device, and wherein the third microelectronic die comprises a non-volatile memory device.

* * * * *